United States Patent
Boehler

(10) Patent No.: US 7,356,741 B2
(45) Date of Patent: Apr. 8, 2008

(54) MODULAR TEST CONTROLLER WITH BIST CIRCUIT FOR TESTING EMBEDDED DRAM CIRCUITS

(75) Inventor: Thomas Boehler, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 590 days.

(21) Appl. No.: 10/304,506

(22) Filed: Nov. 26, 2002

(65) Prior Publication Data

US 2004/0103356 A1    May 27, 2004

(51) Int. Cl.
*G11C 29/00* (2006.01)
*G01R 31/28* (2006.01)

(52) U.S. Cl. .................. 714/718; 714/733; 365/201

(58) Field of Classification Search ................. 714/718, 714/733, 734, 30; 365/201
See application file for complete search history.

(56) References Cited

U.S. PATENT DOCUMENTS

| | | | |
|---|---|---|---|
| 5,051,997 A * | 9/1991 | Sakashita et al. ........... 714/732 |
| 5,862,151 A | 1/1999 | Fagerness | |
| 6,067,262 A | 5/2000 | Irrinki et al. | |
| 6,182,257 B1 * | 1/2001 | Gillingham ................. 714/733 |
| 6,272,588 B1 | 8/2001 | Johnston et al. | |
| 6,415,403 B1 | 7/2002 | Huang et al. | |
| 6,496,947 B1 * | 12/2002 | Schwarz ...................... 714/30 |
| 6,651,202 B1 * | 11/2003 | Phan .......................... 714/733 |
| 6,668,347 B1 * | 12/2003 | Babella et al. .............. 714/733 |
| 6,901,542 B2 * | 5/2005 | Bartenstein et al. ........ 714/719 |
| 2004/0049720 A1 * | 3/2004 | Boehler ...................... 714/718 |

* cited by examiner

*Primary Examiner*—Phung My Chung
(74) *Attorney, Agent, or Firm*—Edell, Shapiro & Finnan, LLC

(57) ABSTRACT

A modular test controller with a built-in self-test (BIST) circuit for testing an embedded DRAM (eDRAM) circuit is provided. The test controller includes a built-in self-test (BIST) core for performing tests, the BIST core including proven testing algorithms; a selectable tester interface for interfacing the BIST core with an external tester; and a selectable eDRAM interface for interfacing the BIST core with an eDRAM, the eDRAM including a plurality of memory cells for storing data. The present invention allows semiconductor device designers to keep to one testflow and reuse a proven BIST core over multiple ASIC (Application Specific Integrated Circuits) products/generations.

18 Claims, 4 Drawing Sheets

MODULAR TEST CONTROLLER WITH BIST CIRCUIT FOR TESTING EMBEDDED DRAM CIRCUITS

BACKGROUND OF THE INVENTION

1. Field of the Invention

The present invention relates generally to semiconductor device design, and more particularly, to a modular test controller with Built-In Self-Test (BIST) functionality for testing an embedded DRAM (eDRAM) circuit and a method for manufacturing the same.

2. Description of the Related Art

To reach a fast product ramp up and a high yield, any standard DRAM or embedded DRAM circuit needs intensive testing. Each DRAM contains redundant wordlines and bitlines to enable reparability of defective memory cells. Most of the commonly used DRAM tests are used to find all possible storage cell failures and then collect all these failures in a so-called fail bit map. With this fail bit map, an external tester calculates the best usage of the on-chip redundancy.

DRAMs embedded into ASICs (Application Specific Integrated Circuits) require different test strategies than standalone commodity DRAMs. Embedded DRAMs (eDRAM) often contain a test controller and/or a BIST (Built-In Self-Test) circuit to simplify the testing. Commodity DRAM's normally do not contain any additional test circuits and are tested through a memory tester, whereas eDRAM's are tested together with the other ASIC circuit parts through a logic tester.

FIG. 7 illustrates an example of a typical implementation of a test system for testing an ASIC (Application Specific Integrated Circuit) 701 containing an embedded DRAM 703 (eDRAM). The eDRAM is testable through an on-chip test controller 702 with BIST functionality. The BIST logic circuitry contains test programs and redundancy algorithms to decide if the eDRAM 703 passed or failed the test, i.e., whether the eDRAM is good or bad. An external logic tester 700 could operate this test controller 702 by serially scanning information in (via scan in data line 706), and out (via scan out data line 708) of the chip. Subsequently, the test controller 702 will issue a pass/fail signal via line 710.

Developing a test flow and testing an eDRAM could be a very difficult and expensive task. Because of its nature, the eDRAM isn't standardized and could be designed with a wide variety of options (e.g., I/O width, SRAM, SDRAM interface, etc.), best suited to fit a certain ASIC product/application. Each of these eDRAM "flavors" would need it's own testflow developed and it's own dedicated BIST/test controller developed. Both of these tasks are time consuming and cost intensive, especially for "time-to-market" sensitive products like ASIC's.

Additionally, the conventional configuration, shown in FIG. 7, does not allow a fail bit map of the eDRAM to be collected. Furthermore, the BIST is hardcoded and interfaces only to one specific eDRAM, and thus, could not be used with a different interface or on a next generation eDRAM without extensive rework.

Accordingly, it would be desirable and highly advantageous to have a modular test controller with BIST functionality for embedded DRAMs on an ASIC so a core BIST circuit, with proven testing algorithms, can be used in multiple products/applications.

SUMMARY OF THE INVENTION

The present invention describes a modular test controller with a Built-In Self-Test (BIST) circuit for testing an embedded DRAM (eDRAM) circuit and a method for manufacturing the test controller. The present invention allows semiconductor device designers to keep to one testflow and reuse a proven BIST core over multiple ASIC products/generations.

According to an aspect of the present invention, a semiconductor device is provided including an embedded dynamic random access memory (eDRAM) for storing data, the eDRAM including a plurality of memory cells; and a test controller for testing the plurality of memory cells to determine if the cells are defective, the test controller including a built-in self-test (BIST) core for performing tests, the BIST core including proven testing algorithms; a selectable tester interface for interfacing the BIST core with an external tester; and a selectable eDRAM interface for interfacing the BIST core with the eDRAM.

According to another aspect of the present invention, the test controller further includes a selectable compression circuit and/or a selectable redundancy calculation circuit.

In a further aspect of the present invention, in a semiconductor device including an embedded dynamic random access memory (eDRAM) for storing data, the eDRAM including a plurality of memory cells, a test controller for testing the plurality of memory cells to determine if the cells are defective is provided. The test controller includes a built-in self-test (BIST) core for performing tests, the BIST core including proven testing algorithms; a selectable tester interface for interfacing the BIST core with an external tester; and a selectable eDRAM interface for interfacing the BIST core with the eDRAM.

According to another aspect of the present invention, a method for manufacturing a semiconductor device having at least one embedded dynamic random access memory (eDRAM) for storing data, the eDRAM including a plurality of memory cells, is provided. The method includes the steps of selecting a build-in self-test (BIST) core having proven testing algorithms; determining a type of external tester to be used to test the semiconductor device; selecting a tester interface for interfacing the semiconductor device to an external tester based on the determined type of external tester; determining a type of eDRAM to be used in the semiconductor device; selecting an eDRAM interface for interfacing the BIST core to an eDRAM based on the determined type of eDRAM, and assembling the BIST core, the selected tester interface and the selected eDRAM interface into a test controller for the semiconductor device.

BRIEF DESCRIPTION OF THE DRAWINGS

The above and other aspects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
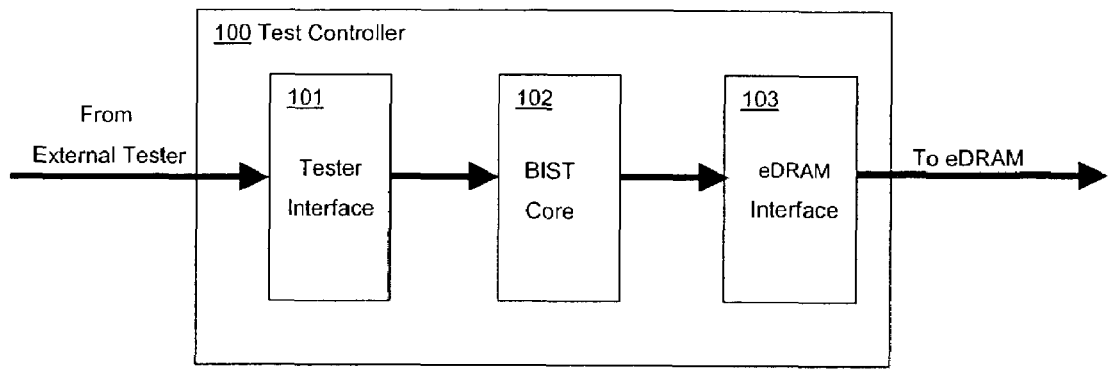
FIG. 1 is a block diagram of a modular test controller with Built-In Self-Test (BIST) functionality according to an embodiment of the present invention.

The present invention provides a modular test controller with a Built-In Self-Test (BIST) circuit or core for testing an embedded DRAM (eDRAM) circuit and method for making the same. FIG. 1 illustrates the general structure of a minimal BIST configuration with a test controller 100 according to an embodiment of the present invention. The test controller 100 includes a tester interface 101 for interfacing the test controller to an external tester, a BIST core 102 for performing tests on the eDRAM and an eDRAM interface 103 for interfacing the eDRAM to the test controller. By dividing the test controller 100 into smaller modules, an increase in flexibility in designing the test controller is achieved. The BIST core 102 can now be kept the same for more generations/different products, whereas the tester interface 101 and the eDRAM interface 103 can be selected to fit any new requirements. The present invention provides a standardized BIST core 102 with a fixed definition for the connections, e.g., input/ouput connections, to all possible module interfaces (e.g., tester interface, compression circuits, eDRAM interface, etc.). This means, the input and output specification to/from the BIST core 102 is fixed and all other modules will follow this "standard" when designed.

Figure 2:
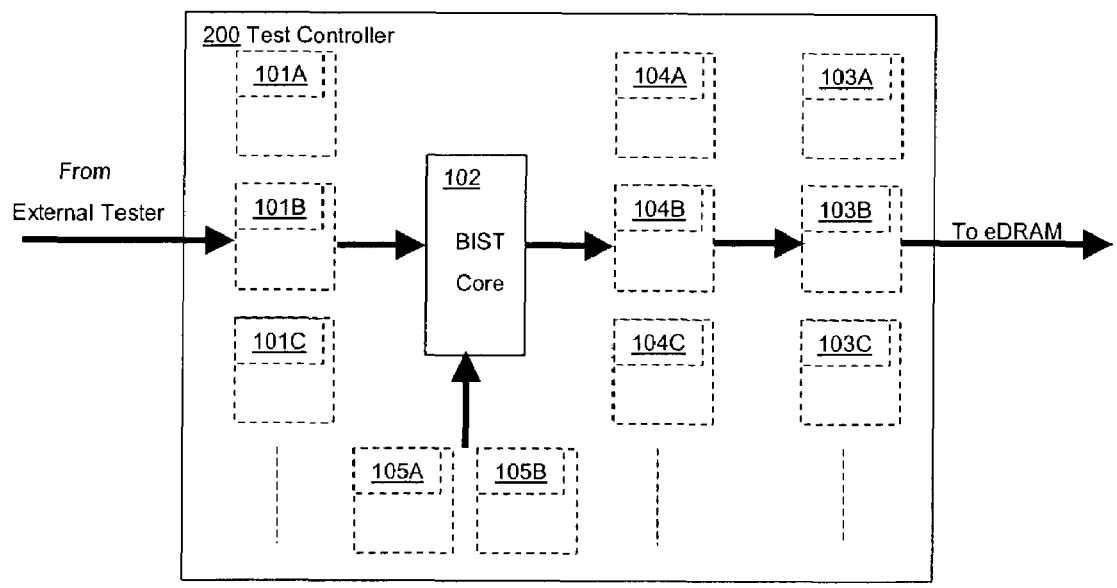
FIG. 2 is a block diagram of a complex modular test controller with BIST functionality according to a second embodiment of the present invention.

FIG. 2 illustrates the general structure of a more complex modular test controller 200 according to a second embodiment of the present invention. The test controller 200 of the second embodiment includes a tester interface 101A, 101B, 101C; a BIST core 102; a eDRAM interface 103A, 103B, 103C; a compression circuit 104A, 104B, 104C; and a redundancy calculation circuit 105A, 105B. It is to be understood each lettered module is a selectable option of a particular module of the test controller 102, e.g., 101A is one of several available tester interfaces 101. It is also to be understood, when manufactured, only one option for each module is actually implemented on the test controller, e.g., 101A for a tester interface, 103B for an eDRAM interface, 104C for a compression circuit and 105A for a redundancy calculation circuit.

By developing different tester interface modules, eDRAM interfaces, compression circuits and redundancy calculation circuits, a tested and proven BIST core can be used in a variety of situations. If new ideas/problems arise, other modules can be added.

All of the modules are developed as soft macros. This means the macros are not yet implemented in hardware in a given technology, they are functional described, logically tested and ready to be used for the final production steps (synthesis, layout, Place & Route, final verification). They are described in a hardware description language (HDL), like VHDL or Verilog. Once all possible modules are developed, the ASIC design engineers chose the modules that they need for their current product at tape out time. Only the specific HDL code for a specific implementation is then synthesized to layout.

The modular test controller is also a very efficient area solution. Instead of having all possible modules in hardware, only the needed ones are implemented in hardware.

Figure 3:
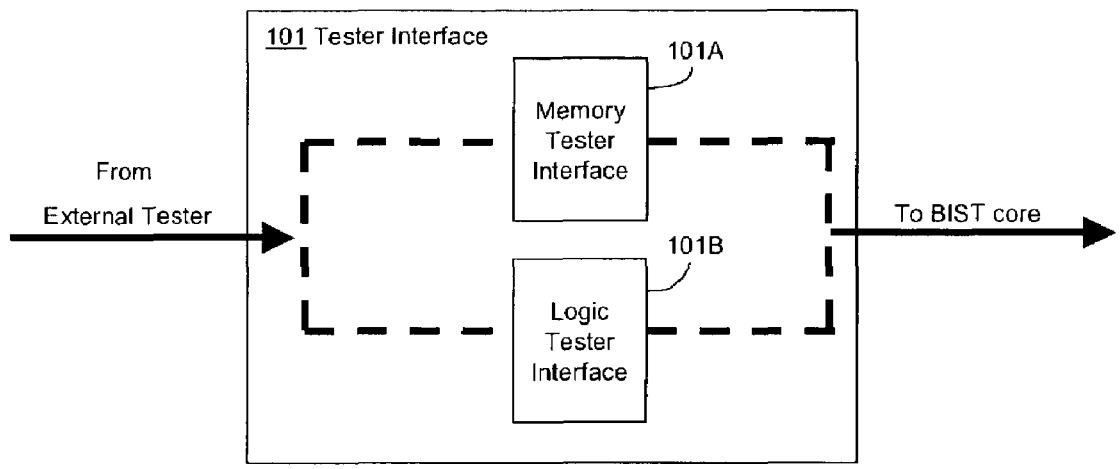
FIG. 3 is a block diagram of an external tester interface of the test controller in accordance with the present invention.

FIG. 3 illustrates an embodiment of the tester interface 101 in accordance with the present invention. Currently, there are two major test platforms: a memory tester 101A and a logic tester 101B. If the ASIC uses large blocks of embedded memory and/or the product is going into mass production, the memory tester interface 101A would be beneficial to allow detailed analysis, but also the availability of certain testers, a test philosophy and/or cost constraints could lead to used of one or the other interface.

Figure 4:
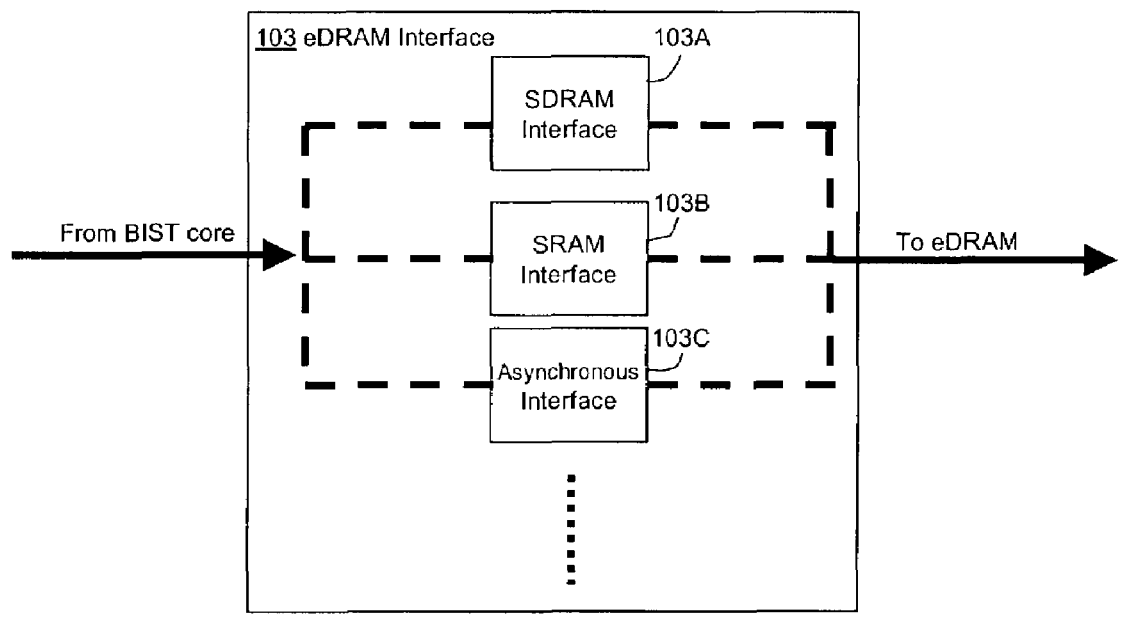
FIG. 4 is a block diagram of an embedded DRAM interface of the test controller in accordance with the present invention.

FIG. 4 illustrates an embodiment of the eDRAM interface 103 in accordance with the present invention. The SDRAM 103A, SRAM 103B and the asynchronous interface 103C are some of the known implementations. Often, the eDRAM will be a replacement for an existing solution with a certain memory interface. For example, if the former memory approach was a two chip solution with an external SDRAM one would choose a SDRAM interface 103A, if the eDRAM will be the replacement for a large amount of SRAM one would choose the SRAM interface 103B, the asynchronous interface 103C would be used if the eDRAM will be the replacement for an asynchronous SRAM.

Figure 5:
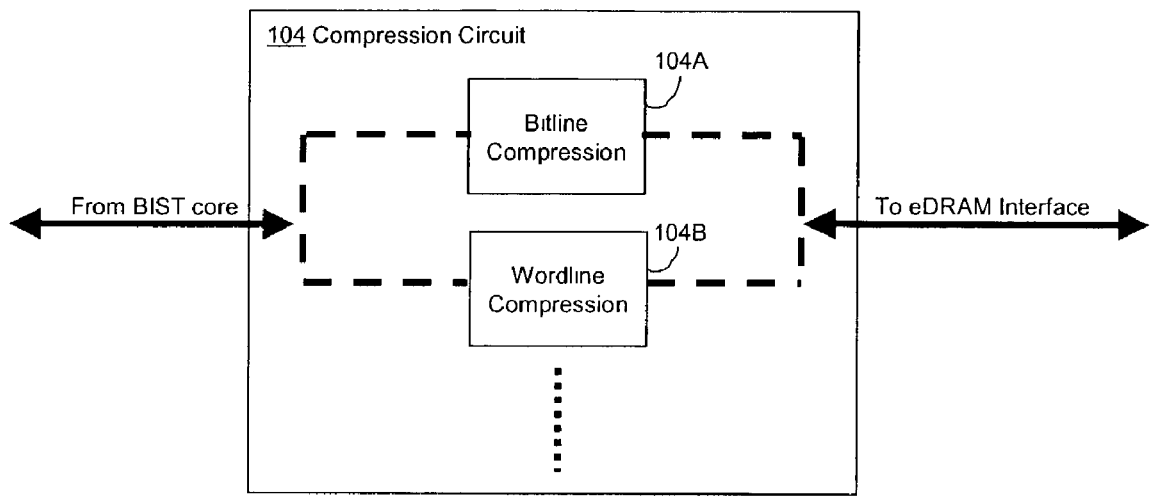
FIG. 5 is a block diagram of a compression circuit of the test controller in accordance with the present invention.

FIG. 5 illustrates an embodiment of the compression circuit 104 in accordance with the present invention. Depending on the eDRAM architecture with its redundancy realization, a module compressing along the bitlines 104A or one compressing over the wordlines 104B could be chosen. If the redundancy elements are organized in bitline clusters one would choose compressing along the bitlines, respectively for the wordlines.

Figure 6:
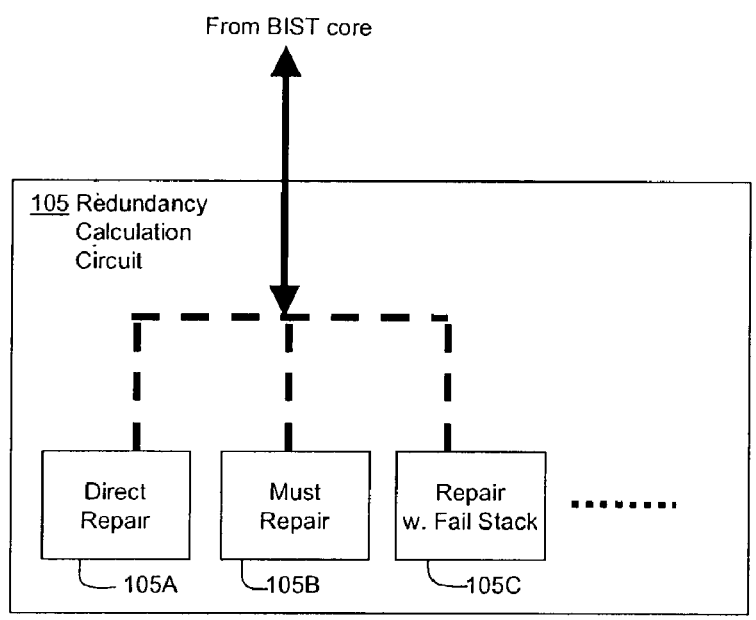
FIG. 6 is a block diagram of a redundancy calculation circuit of the test controller in accordance with the present invention.
Figure 7:
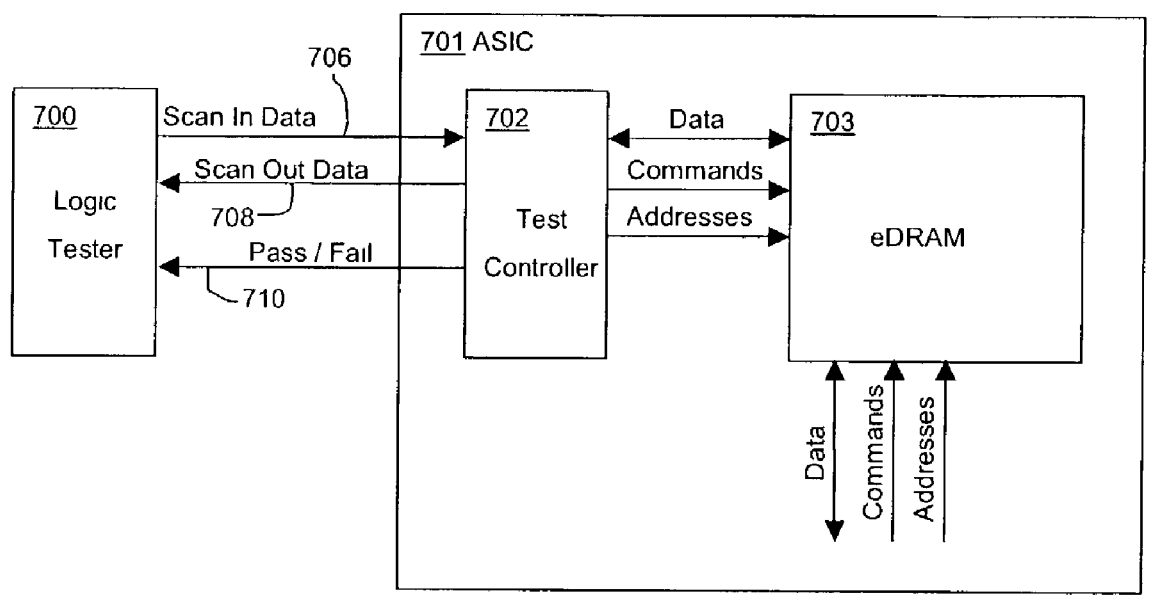
FIG. 7 is a block diagram of a test system including a memory device having a conventional test controller with BIST logic.

FIG. 6 illustrates an embodiment of the redundancy calculation circuit 105 in accordance with the present invention. Again, depending on the eDRAM architecture and/or type of ASIC, application/product different modules would be needed. The trade off between achievable yield and BIST area can lead to a direct repair 105A, a must repair 105B or a repair module with fail stack 105C. Direct 105A and must repair 105B are simple solutions and require less chip area, fail stack repair 105C is more complex, uses the redundancy elements more efficient but requires more area. Therefore, if the ASIC is going to go in mass production and very high yields are targeted one would pay the price of more area. On the other hand, there are ASIC's that could live with failing or faulty bits, so they will not require for the area overhead.

The present invention offers a very open and flexible implementation for testing embedded DRAM's by providing a modular test controller with selectable interfaces. It allows testing of the same eDRAM on different test platforms and/or reuses the same BIST and testflow for different ASIC products. Furthermore, the modularity of the present invention allows the final decision of the test concept for the embedded DRAM to be developed in a very late design phase, e.g., at tape out time. This accommodates a fast "time-to-market" design cycle.

Additionally, the modular approach allows the decoupling of the BIST core from all interface issues. Now, the BIST core could be optimized to maximum performance without having the eDRAM interface even designed. Only the eDRAM interface module has to be designed in parallel with the eDRAM design. This helps to keep the BIST design out of the critical path of an overall product design. Furthermore, having only the needed BIST modules for a specific ASIC application/product reduces the amount of wasted silicon area only for testing purpose.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. A semiconductor device, comprising:
   an embedded dynamic random access memory (eDRAM) for storing data, the eDRAM including a plurality of memory cells; and
   a test controller for testing the plurality of memory cells to determine if the cells are defective, the test controller including:
      a built-in self-test (BIST) core for performing tests on the eDRAM using one or more , proven testing algorithms for testing a plurality of different eDRAM products and eDRAM product generations, the BIST core employing fixed input/output interface definitions;
      selectable tester interface for interfacing the BIST core with an external tester, wherein the selectable tester interface interfaces with said BIST core according to said fixed input/output interface definitions of the BIST core and interfaces with an external tester using one of a plurality of tester interface options depending on a type of external tester to be used for testing the semiconductor device; and
      a selectable eDRAM interface for interfacing the BIST core with the eDRAM using one of a plurality of eDRAM interfaces depending on the type of eDRAM embedded in the semiconductor device.

2. The semiconductor device as in claim 1, wherein one of the plurality of tester interface options that may be implemented in the selectable tester interface is a memory tester interface or a logic tester interface.

3. The semiconductor device as in claim 1, wherein one of the plurality of eDRAM interfaces that may be implemented in the selectable eDRAM interface is a SDRAM interface, a SRAM interface or an asynchronous interface.

4. The semiconductor device as in claim 1, wherein the test controller further comprises a selectable compression circuit.

5. The semiconductor device as in claim 4, wherein the selectable compression circuit is a bitline compression circuit or a wordline compression circuit.

6. The semiconductor device as in claim 1, wherein the test controller further comprises a selectable redundancy calculation circuit.

7. The semiconductor device as in claim 6, wherein the selectable redundancy calculation circuit is a direct repair circuit, a must repair circuit, or a repair with fail stack circuit.

8. In a semiconductor device including an embedded dynamic random access memory (eDRAM) for storing data, the eDRAM including a plurality of memory cells, a test controller for testing the plurality of memory cells to determine if the cells are defective, the test controller comprising:
   a built-in self-test (BIST) core for performing tests on the eDRAM using one or more proven testing algorithms suitable for testing a plurality of different eDRAM products and eDRAM product generations, the BIST core employing fixed input/output interface definitions;
   a selectable tester interface for interfacing the BIST core with an external tester, wherein the selectable tester interface interfaces with said BIST core according to said fixed input/output interface definitions of the BIST core and interfaces with an external tester using one of a plurality of tester interface options depending on a type of external tester to be used for testing the semiconductor device; and
   a selectable eDRAM interface for interfacing the BIST core with the eDRAM using one of a plurality of eDRAM interfaces depending on the type of eDRAM embedded in the semiconductor device.

9. The test controller as in claim 8, wherein one of the plurality of tester interface options that may be implemented in the selectable tester interface is a memory tester interface or a logic tester interface.

10. The test controller as in claim 8, wherein one of the plurality of eDRAM interfaces that may be implemented in the selectable eDRAM interface is a SDRAM interface, a SRAM interface or an asynchronous interface.

11. The test controller as in claim 8, further comprising a selectable compression circuit.

12. The test controller as in claim 11, wherein the selectable compression circuit is a bitline compression circuit or a wordline compression circuit.

13. The test controller as in claim 8, further comprising a selectable redundancy calculation circuit.

14. The test controller as in claim 13, wherein the selectable redundancy calculation circuit is a direct repair circuit, a must repair circuit, or a repair with fail stack circuit.

15. A method for manufacturing a semiconductor device having at least one embedded dynamic random access memory (eDRAM) for storing data, the eDRAM including a plurality of memory cells, the method comprising:
   selecting a built-in self-test (BIST) core having proven testing algorithms for testing a plurality of different eDRAM products and eDRAM product generations, the BIST core employing fixed input/output interface definitions;
   determining a type of external tester to be used to test the semiconductor device;
   selecting one of a plurality of tester interfaces for interfacing the semiconductor device to the external tester based on the determined type of external tester;
   determining a type of eDRAM to be used in the semiconductor device;
   selecting one of a plurality an eDRAM interfaces for interfacing the BIST core to the eDRAM based on the determined type of eDRAM; and
   assembling and implementing in the test controller for the semiconductor device the BIST core, the selected one of the plurality of tester interfaces, and the selected one of the plurality of eDRAM interfaces, wherein said implementing comprises implementing the selected one of the plurality of tester interfaces further in accordance with said fixed input/output interface definitions of the BIST core so as to interface the external tester to the BIST core and implementing the selected of the plurality of eDRAM interfaces further in accordance with said fixed input/output interface definitions of the BIST core so as to interface the eDRAM to the BIST core.

16. The method as in claim 15, further comprising:
determining a type of compression to be used with the determined type of eDRAM;
selecting a compression circuit based on the determined type of compression; and
assembling and implementing the selected compression circuit in the test controller.

17. The method as in claim 15, further comprising:
determining a tradeoff between achievable yield of the semiconductor device and a size of the BIST core;
selecting a redundancy calculation circuit based on the determined tradeoff; and
assembling and implementing the selected redundancy calculation circuit in the test controller.

18. The method as in claim 15, wherein the selecting a tester interface and selecting an eDRAM interface occurs at tape out time of the semiconductor device.

* * * * *